US012563700B2

(12) United States Patent
Liu et al.

(10) Patent No.: US 12,563,700 B2
(45) Date of Patent: Feb. 24, 2026

(54) LOOP HEAT PIPE, HOUSING ASSEMBLY AND ELECTRONIC DEVICE

(71) Applicant: Beijing Xiaomi Mobile Software Co., Ltd., Beijing (CN)

(72) Inventors: Mingyan Liu, Beijing (CN); Anqi Chen, Beijing (CN); Duzi Huang, Beijing (CN); Longhua Duan, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 218 days.

(21) Appl. No.: 18/431,578

(22) Filed: Feb. 2, 2024

(65) Prior Publication Data

US 2024/0407134 A1 Dec. 5, 2024

(30) Foreign Application Priority Data

Jun. 5, 2023 (CN) .......................... 202310659749.6

(51) Int. Cl.
*H05K 7/20* (2006.01)

(52) U.S. Cl.
CPC ................................. *H05K 7/20336* (2013.01)

(58) Field of Classification Search
CPC ................................................. H05K 7/20336
See application file for complete search history.

(56) References Cited

U.S. PATENT DOCUMENTS

| | | | | |
|---|---|---|---|---|
| 10,527,355 | B2 * | 1/2020 | Hurbi ...................... | F28F 23/02 |
| 2020/0350229 | A1 * | 11/2020 | Chang ................ | H05K 7/20309 |
| 2023/0122387 | A1 | 4/2023 | Lin et al. | |
| 2023/0320045 | A1 * | 10/2023 | Lee ....................... | G02F 1/1333 |
| | | | | 361/700 |

FOREIGN PATENT DOCUMENTS

| | | |
|---|---|---|
| CN | 110715570 A | 1/2020 |
| CN | 113543574 A | 10/2021 |
| CN | 216852857 U | 6/2022 |
| CN | 114705071 A | 7/2022 |

OTHER PUBLICATIONS

Sugimoto, K., et al., "Design, Fabrication and Testing of an Ultra-Thin Multi-evaporator Loop Heat Pipe", International Conference on Environmental Systems, 2020, pp. 1-9.
Extended European Search Report issued Jul. 19, 2024 in European Patent Application No. 24155818.8, 5 pgs.

* cited by examiner

*Primary Examiner* — Mukundbhai G Patel

(74) *Attorney, Agent, or Firm* — Oblon, McClelland, Maier & Neustadt, L.L.P.

(57) ABSTRACT

A loop heat pipe includes a housing component, a first capillary structure and a second capillary structure. The housing component is provided with a pipeline unit, a first partition part and at least two evaporation cavities. The evaporation cavity includes a vapor outlet communicated with one end of the pipeline unit and a liquid replenishment port communicated with the other end of a liquid replenishment passage. At least part of the first capillary structure is disposed in the liquid replenishment passage and the evaporation cavities. The second capillary structure is disposed in at least one of the replenishment passage and the evaporation cavities. The second capillary structure includes first bodies that correspond to the evaporation cavities on a one-to-one basis. The first bodies block the liquid replenishment ports of the corresponding evaporation cavities.

20 Claims, 11 Drawing Sheets

First cutting
direction

200

LOOP HEAT PIPE, HOUSING ASSEMBLY AND ELECTRONIC DEVICE

CROSS-REFERENCE TO RELATED APPLICATIONS

The present application claims the benefit of priority to Chinese Application No. CN202310659749.6, filed on Jun. 5, 2023, the contents of which are incorporated herein by reference in their entireties for all purposes.

BACKGROUND

Technical Field

Electronic devices such as mobile phones and tablets have become indispensable technological products in people's life, study and entertainment. With the development of the electronic devices, temperature rise experience has gradually become an important factor considered by consumers when purchasing the electronic devices.

Description of the Related Art

In related arts, a loop heat pipe is usually used to improve heat dissipation efficiency. The loop heat pipe further improves the heat dissipation efficiency through a gas-liquid separation structure.

SUMMARY

The present disclosure relates to the field of electronic technology, and in particular to a loop heat pipe, a housing assembly and an electronic device.

According to a first aspect of an embodiment of the present disclosure, a loop heat pipe is provided, including a housing component, a first capillary structure and a second capillary structure. The housing component is provided with a pipeline unit, a first partition part and at least two evaporation cavities. The pipeline unit is provided with a liquid replenishment passage, the at least two evaporation cavities are spaced apart in a length direction of the liquid replenishment passage, and two adjacent evaporation cavities are separated by the first partition part. At least one of the evaporation cavities includes a vapor outlet communicated with one end of the pipeline unit and a liquid replenishment port communicated with the liquid replenishment passage. At least part of the first capillary structure is disposed in the liquid replenishment passage and at least two evaporation cavities. The second capillary structure is disposed in at least one of the liquid replenishment passage and the evaporation cavities. The second capillary structure includes first bodies that correspond to the evaporation cavities on a one-to-one basis. At least one of the first bodies blocks the liquid replenishment port of the corresponding evaporation cavity, and at least part of the at least one of the first bodies is in contact with the first capillary structure.

According to a second aspect of the embodiments of the present disclosure, a housing assembly is also provided, including a housing and the loop heat pipe in any of the above embodiments, and the loop heat pipe is provided in the housing.

According to a third aspect of the embodiments of the present disclosure, an electronic device is also provided, including heat sources and the loop heat pipe in any of the above embodiments, or the housing assembly in any of the above embodiments, and the heat sources include at least two heat sources corresponding to the evaporation cavities on a one-to-one basis, the heat sources cooperate with the housing assembly in heat conduction, and at least part of the heat sources overlaps with the evaporation cavities on a orthogonal projection surface in a thickness direction of the loop heat pipe.

It should be understood that the above general description and the following detailed description are only exemplary and explanatory, and should not limit the disclosure.

BRIEF DESCRIPTION OF THE DRAWINGS

The brief description of the drawings is provided to help understand the drawings provided in the present disclosure. The schematic drawing embodiments of the present disclosure and the description thereof are used to explain the technical solutions of the present disclosure and do not constitute an improper limitation on the protection scope of the present disclosure.

DETAILED DESCRIPTION

Figure 1:
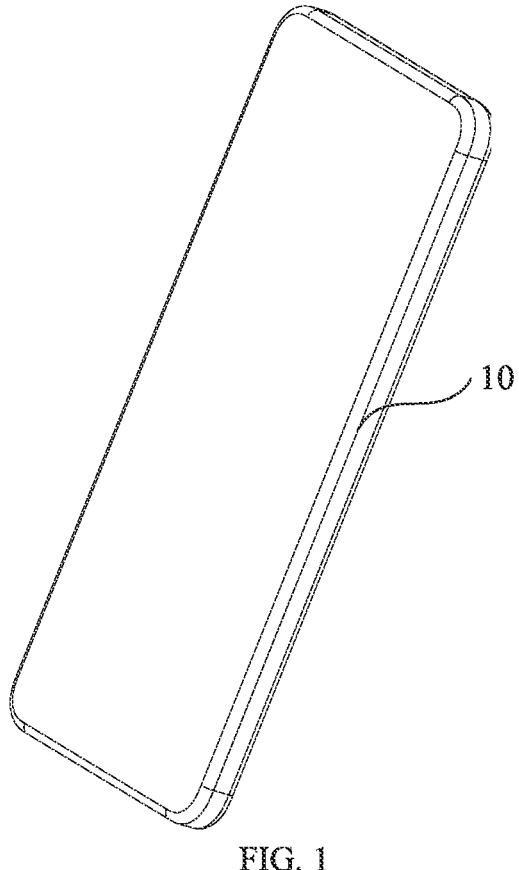
FIG. 1 is a schematic structural diagram of an electronic device shown in an embodiment.

In order to make the purpose, technical solutions and advantages of the present disclosure clearer, the present disclosure will be further described in detail below in conjunction with the accompanying drawings and specific implementations. It should be understood that the specific implementations described here are only used to explain the present disclosure and do not limit the protection scope of the present disclosure.

Unless otherwise defined, all technical and scientific terms used herein have the same meaning as commonly understood by those skilled in the art to which the present disclosure belongs. The terminology used herein in the description of the disclosure is for the purpose of describing specific embodiments only and is not intended to limit the disclosure.

Electronic devices such as mobile phones and tablets have become indispensable technological products in people's life, study and entertainment. With the development of the electronic devices, the internal structure thereof is becoming more and more compact, and although the performance of related devices is becoming more and more powerful, the amount of the heat generated is also increasing. For example, the number of cores of a Central Processing Unit (CPU) of the electronic device is increasing, the performance is increasingly improved while the amount of the heat generated is also increasing. Accordingly, the electronic device generates more and more heat, bringing increasing challenges to the heat dissipation performance of the electronic device. Especially in recent years, temperature rise experience has gradually become an important consideration for consumers when purchasing the electronic device.

However, currently, for the relevant heat dissipation technical solutions applied to the electronic devices, if it desires to improve the heat dissipation efficiency, it is necessary to continue to increase the volume of the heat dissipation structure, which requires occupancy of internal space of the electronic device. In order to improve the heat dissipation efficiency, more and more electronic devices use loop heat pipes with a gas-liquid separation structure to improve heat dissipation efficiency. Some electronic devices may have at least two heat sources, and for the traditional heat dissipation methods, it needs to set separate loop heat pipes for heat dissipation, which takes up a relatively large space. Some loop heat pipes can dissipate heat from at least two heat sources separately, but the manufacturing cost thereof is too high, and if used in the electronic devices, it will cause a too high heat dissipation cost of the electronic device.

In view of this, the present disclosure provides a loop heat pipe that can dissipate heat from at least two heat sources respectively, which is easy to be manufactured, and can effectively reduce manufacturing costs.

In order to better understand the loop heat pipe of the present disclosure, description is provide by way of an electronic device using the loop heat pipe.

Figure 2:
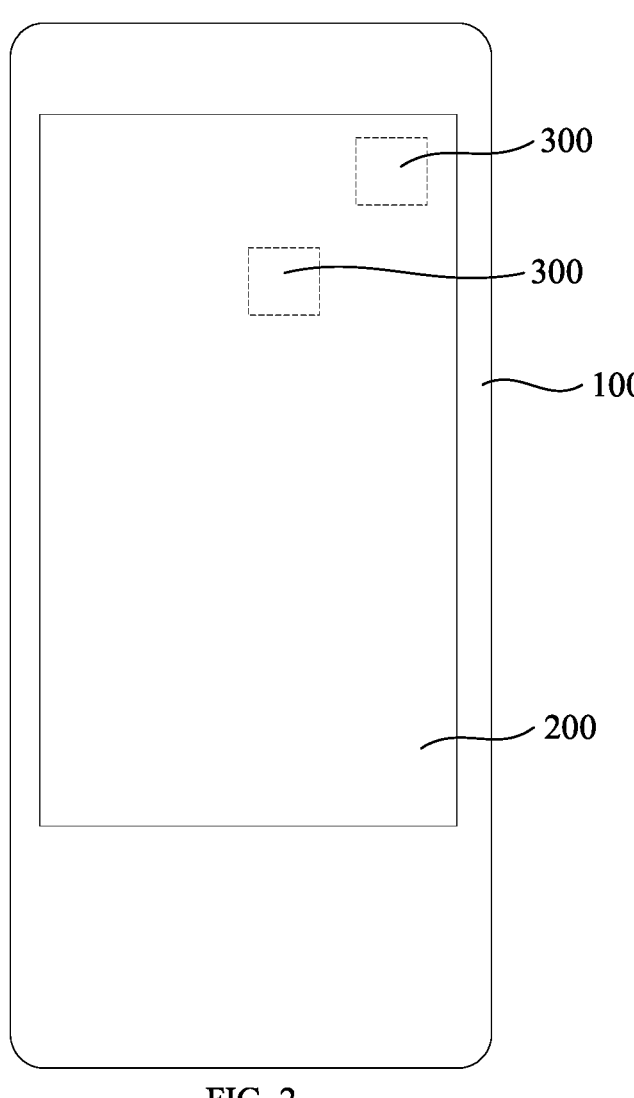
FIG. 2 is a schematic structural diagram of a housing assembly shown in FIG. 1.
Figure 3:
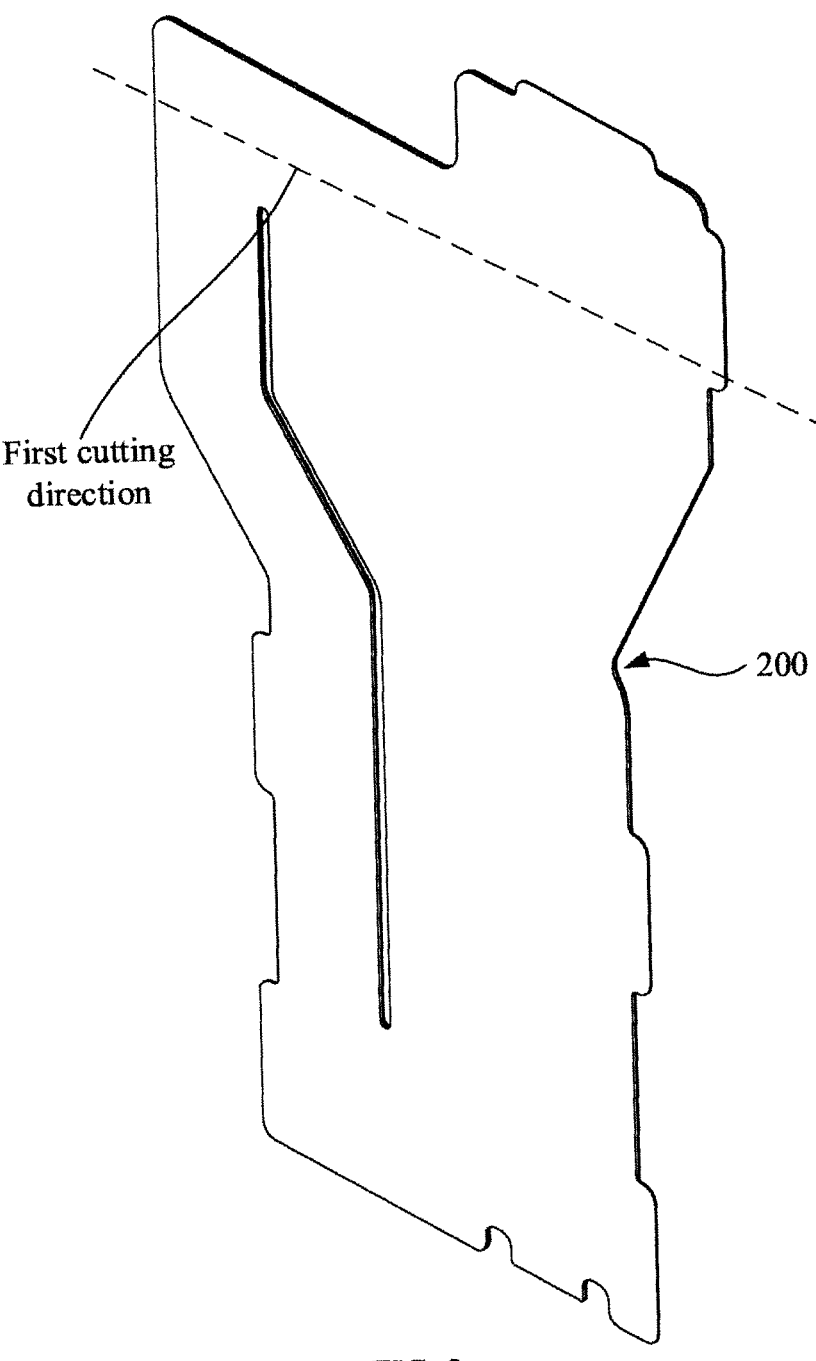
FIG. 3 is a schematic structural diagram of a loop heat pipe shown in FIG. 2.
Figure 4:
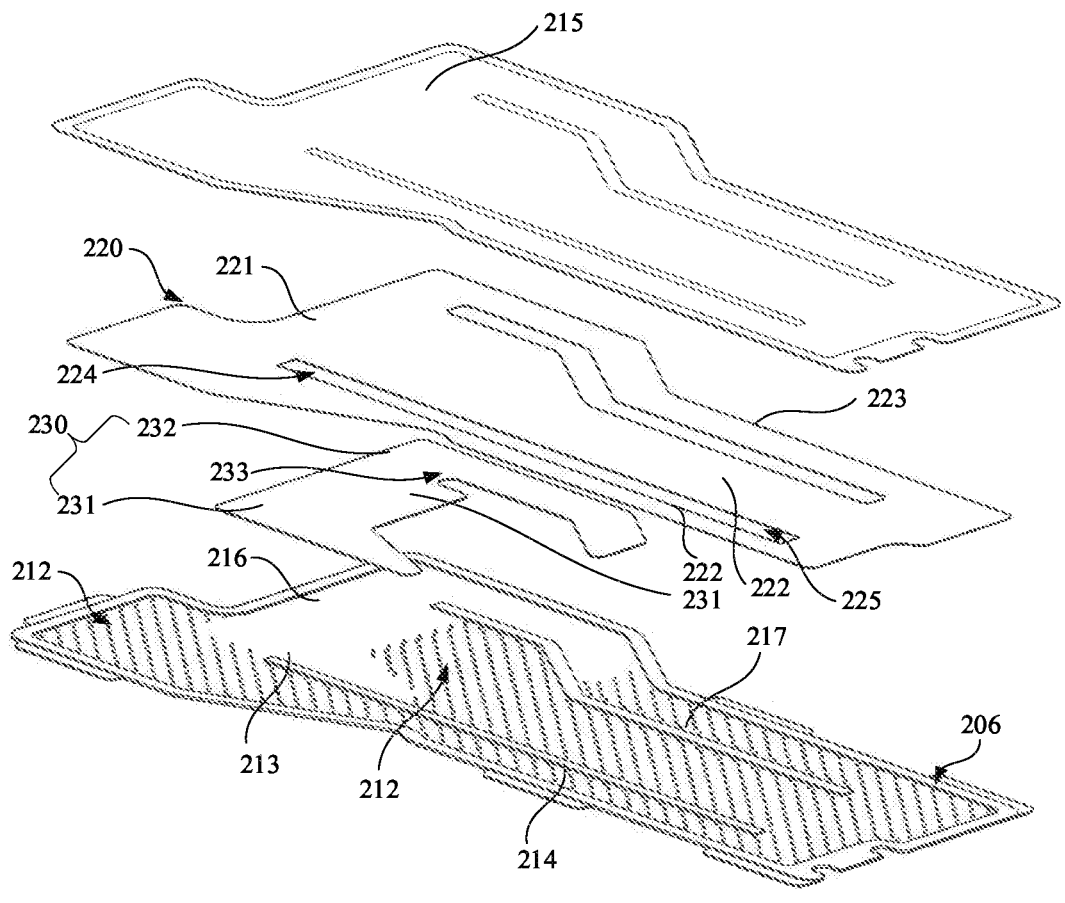
FIG. 4 is an exploded schematic diagram of a structure of a loop heat pipe shown in FIG. 3.
Figure 5:
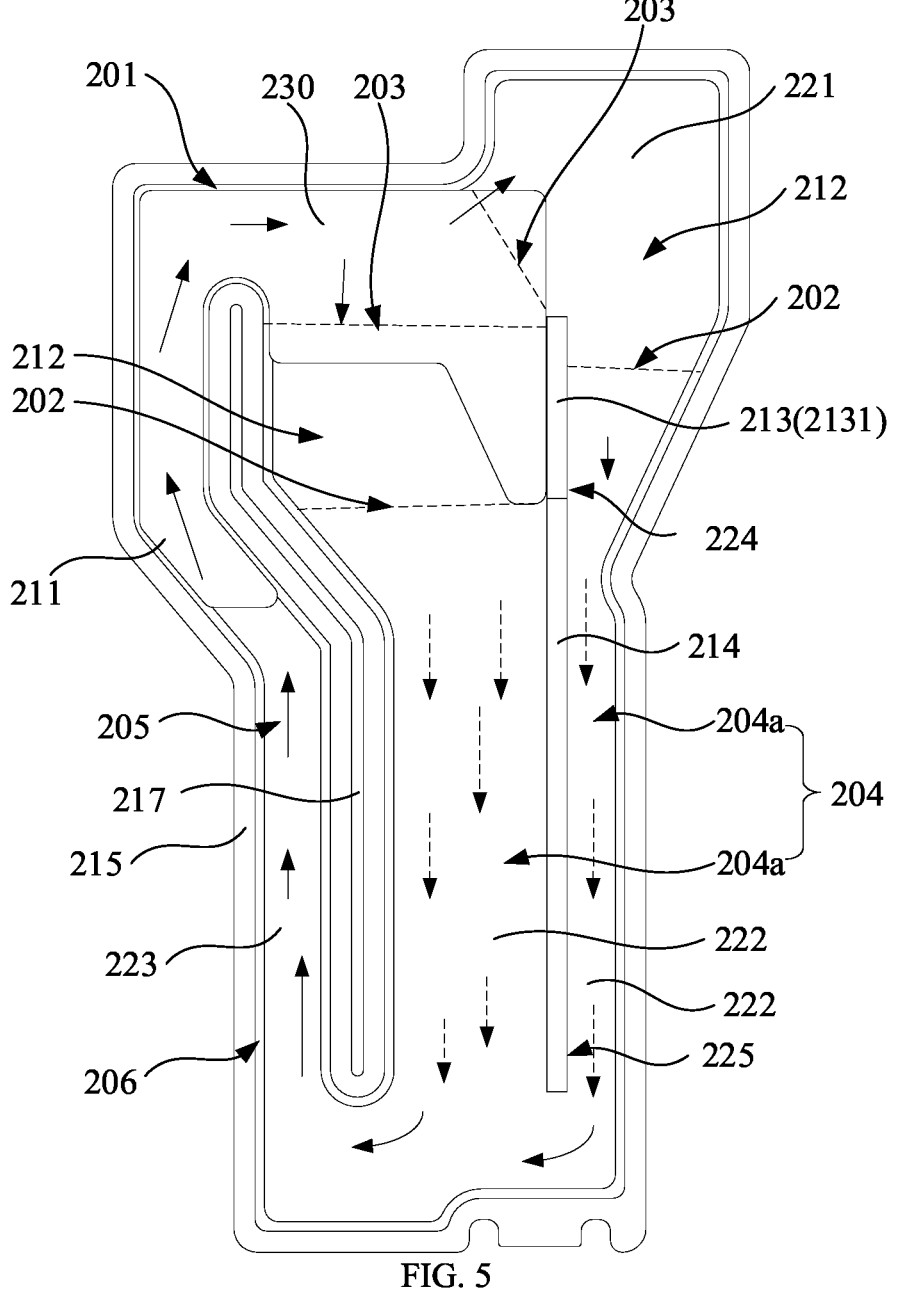
FIG. 5 is a schematic diagram of an internal structure of a loop heat pipe shown in FIG. 3 (with a second housing removed).
Figure 6:
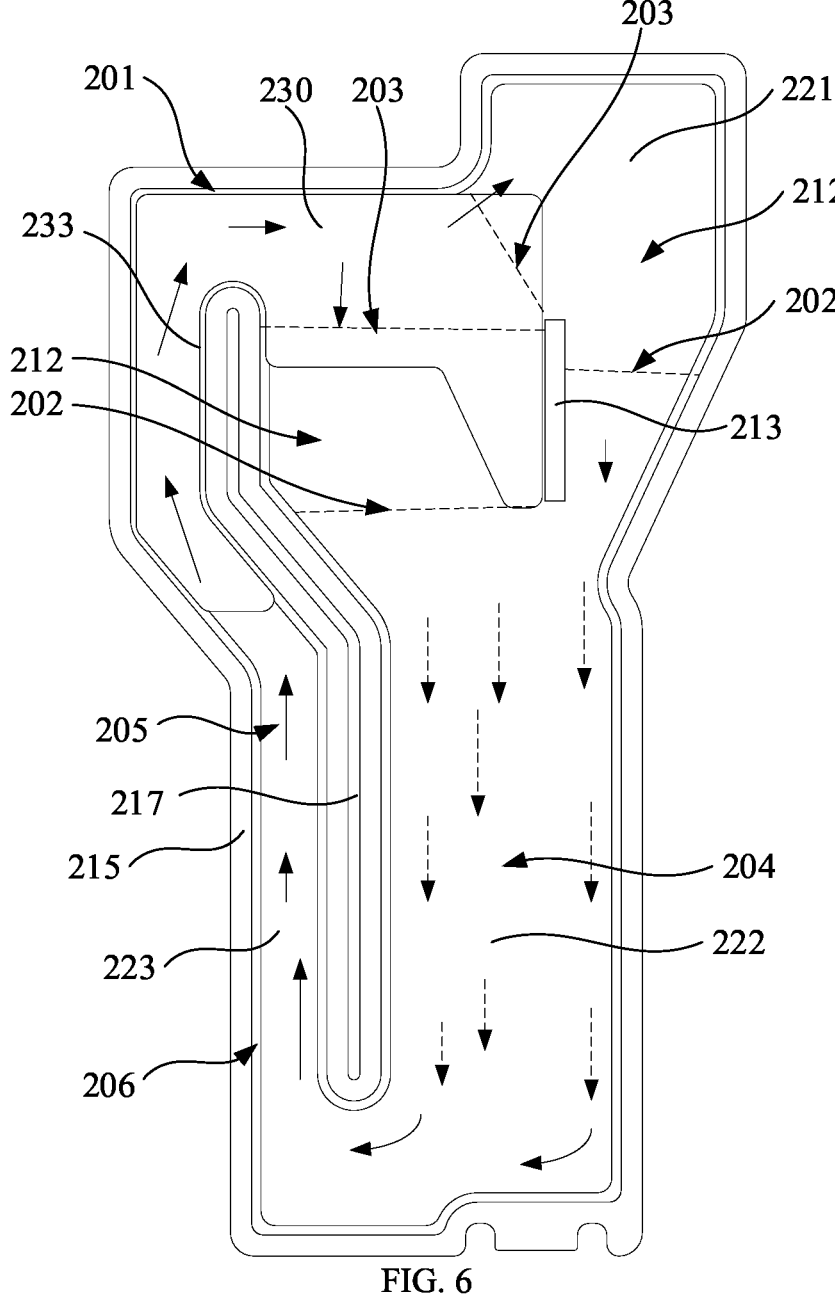
FIG. 6 is a schematic diagram of an internal structure of a loop heat pipe shown in some other embodiments (with a second shell removed).
Figure 7:
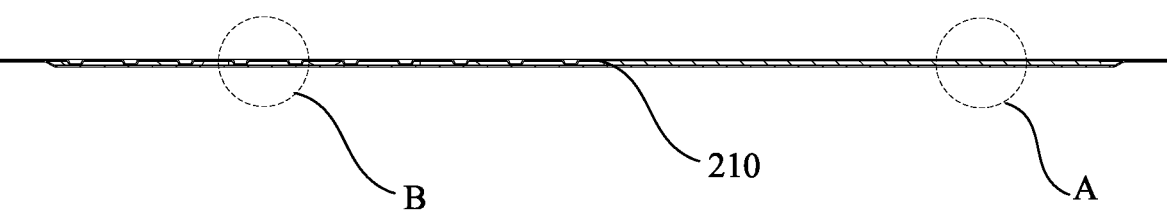
FIG. 7 is a schematic cross-sectional view of a loop heat pipe shown in FIG. 3 in a first cutting direction.
Figure 8:
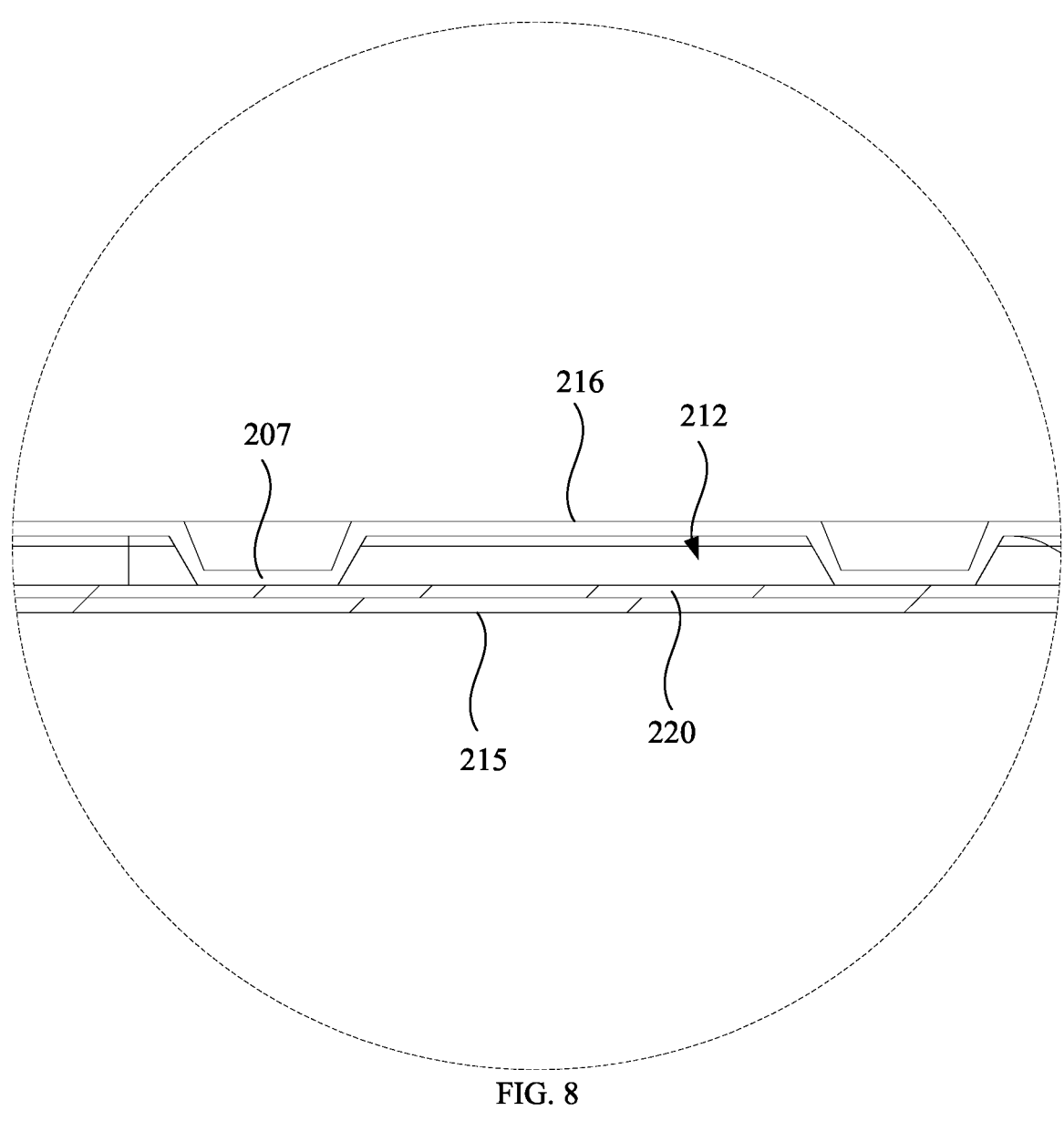
FIG. 8 is an enlarged schematic diagram of area A shown in FIG. 7.
Figure 9:
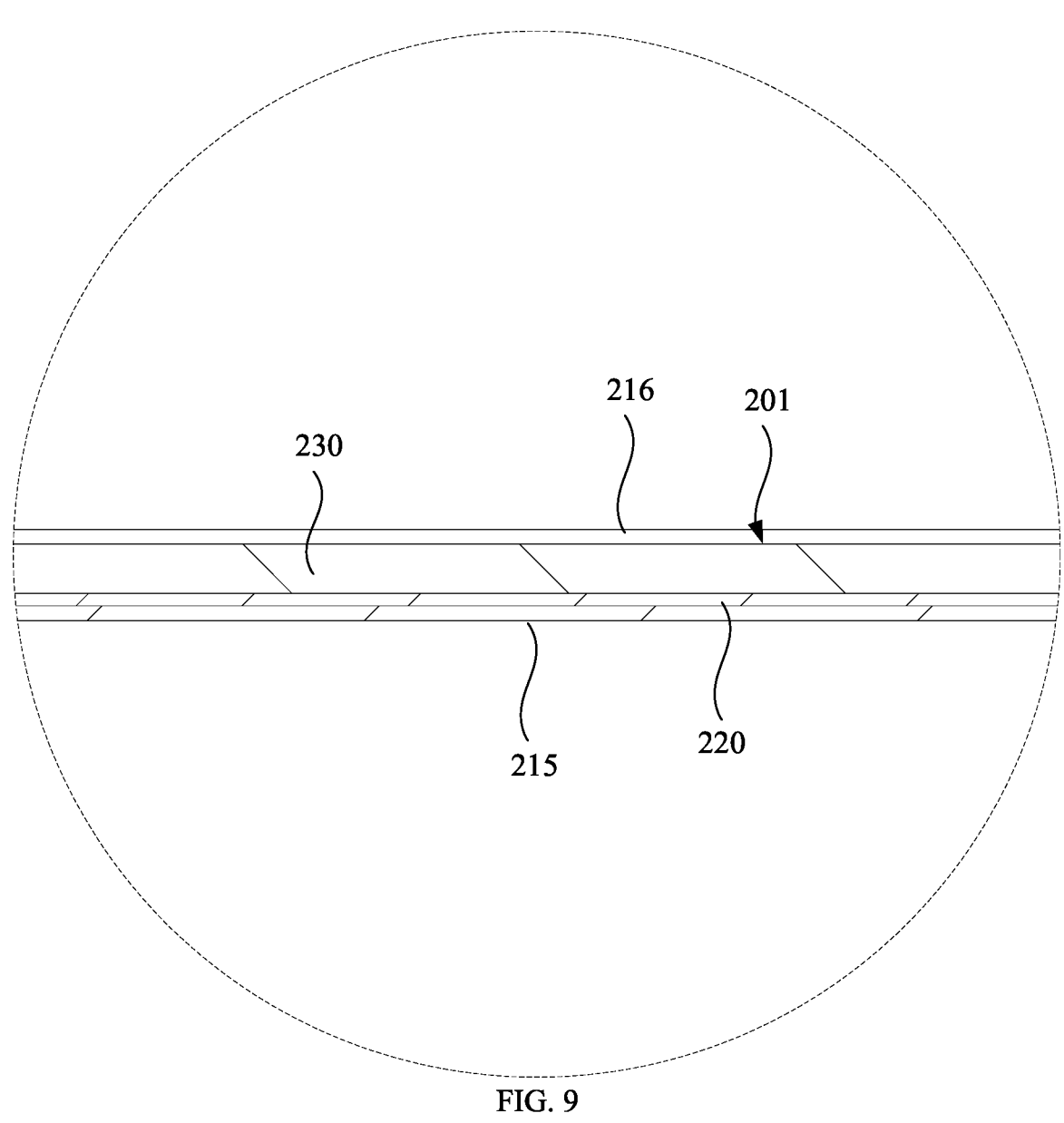
FIG. 9 is an enlarged schematic diagram of area B shown in FIG. 7.

The structural diagrams of an electronic device and a loop heat pipe are shown in FIGS. 1 and 9. FIG. 1 is a schematic structural diagram of an electronic device shown in an embodiment. FIG. 2 is a schematic structural diagram of a housing assembly shown in FIG. 1. FIG. 3 is a schematic structural diagram of a loop heat pipe shown in FIG. 2. FIG. 4 is an exploded schematic diagram of the structure of the loop heat pipe shown in FIG. 3. FIG. 5 is a schematic diagram of the internal structure of the loop heat pipe shown in FIG. 3 (with a second housing removed). FIG. 6 is an enlarged schematic diagram of partial structure of the second housing shown in FIG. 4. FIG. 7 is a schematic cross-sectional view of the loop heat pipe shown in FIG. 3 in a first cutting direction. FIG. 8 is an enlarged schematic diagram of area A shown in FIG. 7. FIG. 9 is an enlarged schematic diagram of area B shown in FIG. 7.

As shown in FIG. 1 and FIG. 2, an electronic device 10 of the present disclosure may be a mobile phone, a tablet computer, an e-reader, a notebook computer, a vehicle-mounted device, etc., which includes heat sources 300 and a loop heat pipe 200.

As shown in FIGS. 2 to 5, the loop heat pipe 200 includes a housing component 210, a first capillary structure 220 and a second capillary structure 230. The housing component 210 is provided with a pipeline unit 211, a first partition part 213 and at least two evaporation cavities 212. The pipeline unit 211 is provided with a liquid replenishment passage 201, the at least two evaporation cavities 212 are spaced apart along a length direction of the liquid replenishment passage 201, and two adjacent evaporation cavities 212 are separated by the first partition part 213. At least one of the evaporation cavities 212 includes a vapor outlet 202 communicated with one end of the pipeline unit 211 and a liquid replenishment port 203 communicated with the liquid replenishment passage 201. At least part of the first capillary structure 220 is disposed in the liquid replenishment passage 201 and the at least two evaporation cavities 212. The second capillary structure 230 is disposed in at least one of the liquid replenishment passage 201 and the evaporation cavities 212. The second capillary structure 230 includes first bodies 231 that correspond to the evaporation cavities 212 on a one-to-one basis. At least one of the first bodies 231 blocks the liquid replenishment port 203 of the corresponding evaporation cavity 212, and at least part of the at least one of the first bodies 231 is in contact with the first capillary structure 220.

The technical solution provided by the embodiments of the present disclosure can include the following beneficial effects.

The loop heat pipe has at least two evaporation cavities and can dissipate heat from at least two heat sources. Two adjacent evaporation cavities are separated by the first partition part, so that the heat between the adjacent evaporation cavities does not interfere with each other. At the same time, by disposing the second capillary structure in at least one of the liquid replenishment passage and the evaporation cavities to block the liquid replenishment ports, an anti-backflow structure can be formed. Accordingly, the liquid contained in the evaporation cavities is heated and evaporates into vapor, which flows out from the vapor outlets to the pipeline unit because the liquid replenishment ports are blocked. The vapor flows to a cold end through the pipeline unit and condenses into liquid, and then flows back to the liquid replenishment ports through the liquid replenishment passage. During this process, the second capillary structure will absorb the condensed liquid and transport it to the first capillary structure that is in contact with it, and replenish the liquid back to the evaporation cavities through the first capillary structure, which improves the heat dissipation performance of the loop heat pipe. As such, the loop heat pipe can dissipate heat from at least two heat sources separately, and form the anti-backflow structure through the capillary structures, making it difficult for the vapor formed by evaporation to flow out from the replenishment ports, thereby achieving separation of gas and liquid in the loop heat pipe. Furthermore, it makes the loop heat pipe easy to be manufactured and implemented, which can effectively reduce manufacturing costs.

As shown in FIG. 2, the heat source 300 includes at least two heat sources, and the at least two heat sources correspond to the evaporation cavities 212 on a one-to-one basis. The heat sources 300 cooperates with the housing component 210 in thermal conduction, and at least part of the heat sources 300 overlaps the evaporation cavities 212 on a orthogonal projection surface in a thickness direction of the loop heat pipe 200.

The loop heat pipe 200 has at least two evaporation cavities 212 and can dissipate heat from the at least two heat sources 300. Two adjacent evaporation cavities 212 are separated by the first partition part 213 so that the heat between the adjacent evaporation cavities 212 does not interfere with each other. The liquid replenishment port 203 of the evaporation cavity 212 is communicated with one end of the liquid replenishment passage 201, the vapor outlet 202 of the evaporation cavity 212 are communicated with one end of the pipeline unit, and the other end of the pipeline unit 211 is communicated with the liquid replenishment passage

201. Besides, by disposing the second capillary structure 230 in at least one of the liquid replenishment passage 201 and the evaporation cavities 212 to block the liquid replenishment port 203, an anti-backflow structure can be formed. In this way, during the use of the electronic device 10, the heat generated by operation of the heat sources 300 will be transferred to the corresponding evaporation cavities 212 through the housing component 210. Then, the liquid contained in the evaporation cavities 212 is heated and evaporates into vapor. It is difficult for the vapor to flow out from the liquid replenishment port 203 because the liquid replenishment port 203 is blocked, and the vapor will flow out from the vapor outlet 202 to the pipeline unit 211. The vapor flows to a cold end of the electronic device 10 through the pipeline unit 211 and is condensed into liquid, and then flows back to the liquid replenishment port 203 through the liquid replenishment passage 201. In this process, the second capillary structure 230 will absorb the condensed liquid and transport it to the first capillary structure 220 that is in contact with the second capillary structure 230, and replenish the liquid back to the evaporation cavities 212 through the first capillary structure 220 so as to continue evaporation and heat dissipation, implementing cooling of the heat sources 300 so as to prevent local overheating of the electronic device 10 from affecting the performance or causing damage of the electronic device 10, thereby improving the heat dissipation performance of the electronic device 10.

In addition, the second capillary structure 230 absorbs the condensed liquid, and the liquid will fill capillary pores of the second capillary structure 230 so that the second capillary structure 230 can efficiently block the vapor from flowing out from the liquid replenishment ports 203.

It can be understood that the loop heat pipe 200 can dissipate heat from at least two heat sources 300 respectively, and the anti-backflow structure can be formed through the capillary structures, so that it is difficult for the vapor formed by evaporation to flow out from the liquid replenishment ports 203, thereby realizing gas-liquid separation in the loop heat pipe 200. This further makes the loop heat pipe 200 easy to be manufactured and implemented, and can effectively reduce manufacturing costs. In this way, the electronic device 10 employing the loop heat pipe 200 has good heat dissipation performance, and the loop heat pipe 200 also has low manufacturing cost, which is beneficial to reducing the heat dissipation cost of the electronic device 10.

It should be noted that in some embodiments, at least one of the at least two evaporation cavities 212 corresponding to the at least two heat sources includes the structure as mentioned above. That is, at least one of the evaporation cavities 212 includes the vapor outlet 202 communicated with one end of the pipeline unit 211 and the liquid replenishment port 203 communicated with the liquid replenishment passage 201. For example, one or more of the evaporation cavities 212 each includes a vapor outlet 202 communicated with one end of the pipeline unit 211 and a liquid replenishment port 203 communicated with the liquid replenishment passage 201. For another example, each of the evaporation cavities 212 includes a vapor outlet 202 communicated with one end of the pipeline unit 211 and a liquid replenishment port 203 communicated with the liquid replenishment passage 201.

It should be noted that in some embodiments, for the first bodies 231 of the second capillary structure 230 that respectively correspond to the evaporation cavities 212, at least one of the first bodies 231 blocks the liquid replenishment port 203 of the corresponding evaporation cavity 212, and at least part of the at least one first body 231 is in contact with the first capillary structure 220. For example, one or more of the first bodies 231 each blocks the liquid replenishment port 203 of the corresponding one or more evaporation cavities 212, and at least part of each of the one or more first bodies 231 is in contact with the first capillary structure 220. For another example, each of the first bodies 231 blocks the liquid replenishment port 203 of the corresponding evaporation cavity 212, and at least part of each of the first bodies 231 is in contact with the first capillary structure 220. Accordingly, each of the liquid replenishment port(s) 203 can be blocked by a corresponding first body.

It should be noted that "the second capillary structure 230 is disposed in at least one of the liquid replenishment passage 201 and the evaporation cavities 212" includes that the second capillary structure 230 is disposed in the liquid replenishment passage 201, the second capillary structure 230 is disposed in the evaporation cavities 212, and the second capillary structure 230 is disposed between the liquid replenishment passage 201 and the evaporation cavities 212, as long as the second capillary structure 230 can block the liquid replenishment ports 203 without affecting the transport function of the pipeline unit 211 and the evaporation function of the evaporation cavities 212.

It should be noted that "the second capillary structure 230 blocks the liquid replenishment ports 203" should be understood in a broad sense, which includes but is not limited to that the second capillary structure 230 blocks part of the liquid replenishment port 203 to reduce a hollow out area of the liquid replenishment port 203, and that the second capillary structure 230 is filled in the liquid replenishment port 203 to reduce the hollow out area of the liquid replenishment port 203.

It should be noted that the second capillary structure 230 blocking the liquid replenishment ports 203 can be understood as that the second capillary structure 230 can block the vapor in the evaporation cavities 212 from flowing to the liquid replenishment ports 203 side, but will not affect flowing of the liquid at the liquid replenishment ports 203 to the evaporation cavities 212. The second capillary structure 230 is provided between the evaporation cavities 212 and the liquid replenishment ports 203. The second capillary structure 230 can be stacked on the first capillary structure 220 or arranged side by side with the first capillary structure 220. When the first capillary structure 220 and the second capillary structure 230 are stacked, a sum of sizes of the first capillary structure 220 and the second capillary structure 230 in the thickness direction is equal to an inner size of the pipeline unit 211 in the thickness direction (as shown in FIG. 9). When the first capillary structure 220 and the second capillary structure 230 are arranged side by side, the size of the second capillary structure 230 in the thickness direction is equal to the inner size of the pipeline unit 211 in the thickness direction.

The first capillary structure 220 and the second capillary structure 230 can be capillary structures with the same or different capillary densities. For example, the first capillary structure 220 and the second capillary structure 230 can be capillary structures with different thicknesses and the same capillary density. The thickness of the first capillary structure 220 is smaller than the thickness of the second capillary structure 230, so that the first capillary structure 220 is used to transport working medium in a liquid state, and the second capillary structure 230 is used to block the working medium in a gas state from flowing to the liquid replenishment ports 203 side. In addition, the thickness and capillary density of the first capillary structure 220 and the second capillary structure 230 can be adjusted according to actual stacking requirements.

It should be noted that parameters such as the arrangement manner and thickness of the first capillary structure 220 and the second capillary structure 230 are not specially limited in the embodiments of the present disclosure, and those described above are only examples and not limitation.

It should be noted that the first capillary structure 220 and the second capillary structure 230 can be implemented in a variety of forms, such as a grooved capillary structure, a mesh (woven) capillary structure, a fiber capillary structure, a sintered capillary structure, etc.

As shown in FIG. 2, in some embodiments, the electronic device 10 further includes a housing 100, and the loop heat pipe 200 is provided in the housing 100. In this way, the loop heat pipe 200 is integrated onto the housing 100 to facilitate dissipation of the heat from the heat sources 300 installed in the housing 100 through the use of the evaporation cavities 212 and transfer the heat to the cooling part through the use of the pipeline unit 211, thereby making full use of the space of the housing 100 for heat dissipation, improving the heat dissipation performance of the housing 100 and improving the heat dissipation efficiency of the components integrated onto the housing 100, especially the heat sources 300 that easily generate heat (such as a processor, CPU, etc.).

It should be noted that the housing 100 can be a middle frame, a battery cover, a back cover, or the like. It can be understood that integrating the loop heat pipe 200 with the housing 100 includes, for example, embedding the loop heat pipe 200 in the middle frame to form an integrated middle frame component, or integrating the loop heat pipe 200 and the battery cover into an integrated housing component 10a. That is to say, the type of the housing 100 is not particularly limited in the embodiments of the present disclosure.

In some embodiments, the housing 100 and the loop heat pipe 200 are assembled in modules to form the housing component 10a. In this way, the housing component 10a has good heat dissipation performance, and it facilitates improving the assembly efficiency of the electronic device 10.

In some embodiments, the heat source 300 may be a control motherboard equipped with a processor, a screen module, a camera module, etc. The housing 100 is provided with a heat conduction area (not shown) for the heat source 300 which is disposed opposite to the evaporation cavity 212 along the thickness direction of the housing 100. The heat source 300 is in heat conduction fit with the evaporation cavity 212 through the heat conduction area for the heat source 300. Accordingly, it can not only increase the heat dissipation area for the heat source 300 through the housing 100, but also improve the heat dissipation efficiency by using the loop heat pipe 200, which effectively prevents the heat source 300 from overheating.

In an embodiment of the present disclosure, the housing 100 may be a bearing structure of the electronic device 10. In addition to the loop heat pipe 200 that can be integrated into the housing, at least some of the components of the electronic device 10 may be directly or indirectly disposed on the housing 100 to be assembled into the electronic device 10. For example, the control motherboard is installed on the housing 100 so that the processor and the evaporation cavities 212 are oppositely disposed along the thickness direction of the housing 100.

In some embodiments, the housing 100 may be disposed inside the electronic device 10, and an edge of the housing 100 may be designed as part of a casing of the electronic device 10. When the edge of the housing 100 is used as the casing of the electronic device 10, it can function to protect the electronic device 10.

In some embodiments, the housing 100 may have a planar or planar-like structure. Therefore, two sides of the housing 100 may be visually distinguished, and the two sides may be referred to as a front side and a back side of the housing 100, or the two sides may be referred to as one side and the other side of the housing 100. The interior of the housing 100 may be partially hollowed out as needed to accommodate other components in the electronic device 10.

It should be noted that part or all of the housing 100 may be made of a metal or alloy material (for example, aluminum alloy). Of course, the housing 100 can also be made of other materials, which is not specifically limited in the embodiments of the present disclosure.

In some embodiments, the material of the housing 100 is aluminum alloy or steel. Therefore, the housing 100 has good thermal conductivity, which facilitates transferring the heat from the heat sources 300 to the loop heat pipe 200.

It should be noted that, in addition to being disposed on the housing 100, the loop heat pipe 200 can also be disposed on other parts of the electronic device 10.

For example, in some embodiments, the loop heat pipe 200 is disposed between the screen and the middle frame.

For another example, in some embodiments, the loop heat pipe 200 is disposed on the side of the battery cover (also called a back cover). That is, the loop heat pipe 200 is stacked on other bearing members, heat dissipation components or heat sources 300 along the thickness direction of the electronic device 10 to directly or indirectly improve the heat dissipation efficiency of the heat sources 300 and avoid local overheating of the electronic device 10.

In the embodiments of the present disclosure, the heat sources 300 refer to devices in the electronic device 10 that radiate relatively more heat.

In practical applications, the heat radiated by a device is usually positively correlated with the power consumption of the device. The greater the power consumption of the device, the greater the heat radiated by the device. Correspondingly, the heat sources 300 in the present disclosure may be devices in the electronic device 10 the power consumption of which exceeds M % of the power consumption of the entire electronic device, where M may be 30, 40, etc.

In some embodiments, the heat sources 300 may include a central processor, a processing device integrating processing and storage functions, a power supply component such as a battery, and the like. Of course, the heat sources 300 can also be other devices, such as an image sensor, etc., which are not specifically limited in the embodiments of the present disclosure.

It should be noted that the "cold end of the electronic device 10" generally refers to a position where the temperature rises slower than the heat sources 300, that is, the position where the internal temperature of the electronic device 10 is lower than the temperature of the "heat sources 300" during the use of the electronic device 10.

In some embodiments, the loop heat pipe 200 also includes working medium (not shown) disposed in the pipeline unit 211 and the evaporation cavities 212, and the second capillary structure 230 blocks the liquid replenishment ports 203 to cause the working medium to move in a direction toward the vapor outlets 202. In this way, the working fluid in the liquid state can be evaporated into a vapor state. The working fluid in the vapor state can flow into the pipeline unit 211 through the vapor outlets 202, and can be re-liquefied in the pipeline unit 211 and then transported to the liquid replenishment ports 203 through the capillary structure.

Specifically, during the use of the electronic device 10, the heat generated by the operation of the heat sources 300 will be transferred to the evaporation cavities 212 through the housing component 210. Then, the working medium contained in the evaporation cavities 212 is heated and evaporates into vapor. It is difficult for the vapor to flow out from the liquid replenishment ports 203, and the vapor flows out from the vapor outlets 202 to the pipeline unit 211. The vapor flows to the cold end of the electronic device 10 through the pipeline unit 211 and is condensed back into the liquid working medium, and flows back to the liquid replenishment ports 203 through the liquid replenishment passage 201. During this process, the second capillary structure 230 will adsorb the condensed working medium and transport it to the first capillary structure 220 that is in contact with the second capillary structure 230, and replenish the working medium back to the evaporation cavities 212 through the first capillary structure 220 to continue evaporation and heat dissipation, achieving cooling of the heat sources 300 to prevent local overheating of the electronic device 10 from affecting the performance or causing damage of the electronic device 10, and to improve the heat dissipation performance of the electronic device 10.

It should be noted that the "working medium" includes but is not limited to coolant and other fluids that can be applied to the loop heat pipe 200, and the boiling point of the "working medium" can be adjusted according to actual needs and is not limited here.

In some embodiments, the first capillary structure 220 is disposed in the evaporation cavities 212 to form an evaporator.

On the basis of any of the above embodiments, as shown in FIGS. 4, 5 and 9, in some embodiments, at least part of the second capillary structure 230 is stacked on the first capillary structure 220 to block the liquid replenishment ports 203. In this way, the contact area between the second capillary structure 230 and the first capillary structure 220 can be increased, and the liquid stored in the second capillary structure 230 can be transported to the first capillary structure 220 more efficiently, which facilitates replenishing the liquid back to the evaporation cavities 212 through the first capillary structure 220.

Alternatively, in some other embodiments, at least part of the second capillary structure 230 is filled in the pipeline unit 211 to block the liquid replenishment ports 203. In this way, the second capillary structure 230 can be directly filled in the pipeline unit 211 to block the liquid replenishment ports 203, making the arrangement of the first capillary structure 220 and the second capillary structure 230 more flexible.

On the basis of any of the above embodiments, in some embodiments, the thickness of the first capillary structure 220 is H1, 0.02 mm≤H1≤0.1 mm. As such, the thickness of the first capillary structure 220 can be flexibly set so that the evaporation cavities 212 have enough evaporation space to facilitate rapid evaporation of the liquid stored in the first capillary structure 220 into vapor.

In some embodiments, 0.04 mm≤H1≤0.08 mm.

In some embodiments, H1=0.02 mm, 0.03 mm, 0.04 mm, 0.05 mm, 0.06 mm, 0.07 mm, 0.08 mm, 0.09 mm, or 0.1 mm.

In some embodiments, the second capillary structure 230 includes at least one layer of capillary structure. In this way, the second capillary structure 230 can be formed by one layer of capillary structure, or can be formed by superimposing multiple layers of capillary structures.

For example, a capillary structure is cut into a set shape, and multiple layers of such capillary structure are superposed to form the second capillary structure 230. The capillary structure can also be cut into the first capillary structure 220. In this way, one kind of capillary structure can be used to form the first capillary structure 220 and the second capillary structure 230, which is beneficial to cost saving.

In some embodiments, the thickness of the second capillary structure 230 is H2, and 0.1 mm≤H2≤0.3 mm. As such, the thickness of the second capillary structure 230 can be reasonably set according to the size of the liquid replenishment ports 203, which can block the liquid replenishment ports 203 without affecting the backflow of the liquid.

In some embodiments, 0.15 mm≤H2≤0.25 mm.

In some embodiments, H1=0.1 mm, 0.12 mm, 0.15 mm, 0.18 mm, 0.2 mm, 0.21 mm, 0.23 mm, 0.25 mm, 0.27 mm, or 0.3 mm. It should be noted that H1 can be any value within a range of 0.02 mm~0.1 mm, and those listed above are merely examples and not limitation.

On the basis of any of the above embodiments, in some embodiments, the maximum thickness of the loop heat pipe 200 is 0.2 mm to 0.5 mm. As such, the loop heat pipe 200 is made as light and thin as possible to meet the thin and light design requirements of the electronic device 10. It should be noted that H2 can be any value within the range of 0.1 mm~0.3 mm, and those listed above are only examples and not limitation.

In some embodiments, the second capillary structure 230 includes at least one layer of capillary structure. In this way, the second capillary structure 230 can be formed by one layer of capillary structure, or can be formed by superimposing multiple layers of capillary structures.

For example, a capillary structure is cut into a set shape, and multiple layers of such capillary structure are superposed to form the second capillary structure 230. The capillary structure can also be cut into the first capillary structure 220. In this way, one kind of capillary structure can be used to form the first capillary structure 220 and the second capillary structure 230, which is beneficial to cost saving.

In some embodiments, the maximum thickness of the loop heat pipe 200 is 0.2 mm, 0.22 mm, 0.25 mm, 0.28 mm, 0.3 mm, 0.31 mm, 0.33 mm, 0.35 mm, 0.37 mm, 0.4 mm, 0.41 mm, 0.43 mm, 0.45 mm, 0.47 mm, or 0.5 mm. It should be noted that the maximum thickness of the loop heat pipe 200 can be any value within the range of 0.2 mm to 0.5 mm, and those listed above are only examples and not limitation.

It should be noted that the first partition part 213 can be implemented in a variety of forms, including at least one of a partition plate, an isolation strip, an isolation hole, etc.

Figure 11:
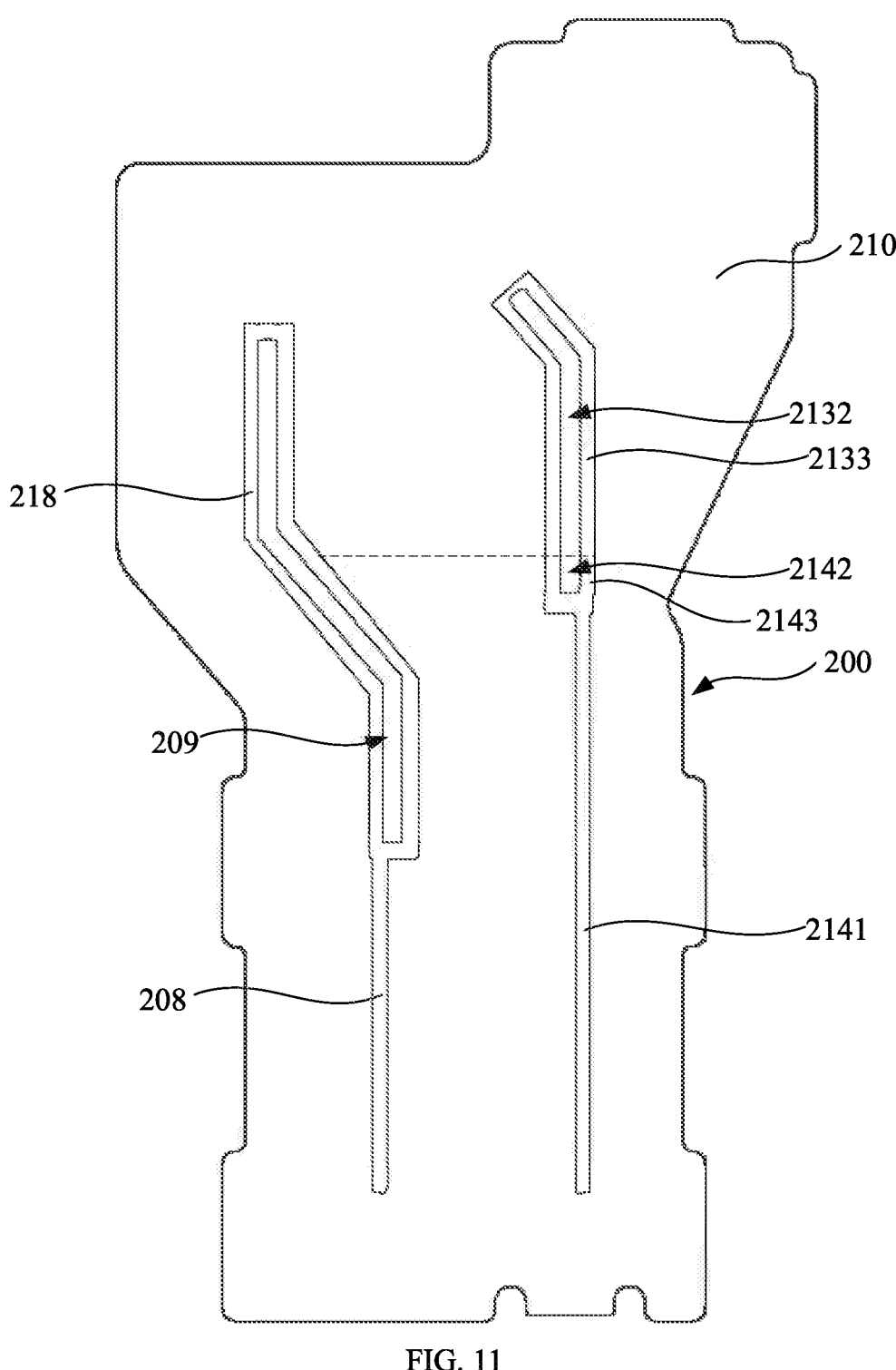
FIG. 11 is a schematic structural diagram of a loop heat pipe shown in another embodiment.

As shown in FIG. 4 and FIG. 11, in some embodiments, the first partition part 213 includes a first partition plate 2131, and the first partition plate 2131 is disposed between two adjacent evaporation cavities 212. In this way, two adjacent evaporation cavities 212 are separated by the partition plate to reduce mutual interference, which is easy to be implemented.

As shown in FIG. 11, in some embodiments, the first partition part 213 includes a first isolation hole 2132, and the first isolation hole 2132 is used to separate two adjacent evaporation cavities 212. In this way, the isolation hole can be used to separate two adjacent evaporation cavities 212 to reduce mutual interference. Besides, two adjacent evaporation cavities 212 are spaced apart through the isolation hole, thereby reducing direct heat transfer through the housing component 210 and further reducing mutual interference.

As shown in FIG. 11, in some embodiments, the first partition part 213 includes a first partition plate 2131 and a first isolation hole 2132. The first isolation hole 2132 cooperates with the first partition plate 2131 to separate two adjacent evaporation cavities 212.

It should be noted that the second capillary structure 230 can be implemented in various forms. For example, it includes at least two first bodies 231 that are provided separately and are used to block the liquid replenishment ports 203 of the corresponding evaporation cavities 212.

As shown in FIGS. 4 and 5, in some embodiments, the second capillary structure 230 includes a second body 232 disposed in the liquid replenishment passage 201. The first bodies 231 are in contact with the first capillary structure 220 and connected to the second body 232 to block the liquid replenishment ports 203. In this way, by disposing the first bodies 231 in the evaporation cavities 212 and disposing the first bodies 231 to be in contact with the first capillary structure 220, the liquid can be quickly transported to the evaporation cavities 212, and by disposing the second body 232 in the liquid replenishment passage 201, the liquid suction speed can be increased, thereby further increasing the liquid replenishing speed of the evaporation cavities 212.

It can be understood that connecting the second body 232 to the at least two first bodies 231 is beneficial to increasing the blocking thickness, improving the effect of blocking the vapor, and further improving the anti-backflow performance of the loop heat pipe 200.

On the basis of any of the above embodiments, as shown in FIG. 5, in some embodiments, the pipeline unit 211 also includes a vapor passage 204 and a flow return passage 205. One end of the vapor passage 204 is communicated with the vapor outlets of the at least two evaporation cavities 212, the other end of the vapor passage 204 is communicated with one end of the flow return passage 205, and the other end of the flow return passage 205 is communicated with the liquid replenishment passage 201. At least part of the second capillary structure 230 is provided in the liquid replenishment passage 201 and the flow return passage 205. In this way, the vapor flowing out of the evaporation cavities 212 is transported through the vapor passage 204, the condensed vapor is transported to the liquid replenishment passage 201 through the flow return passage 205, and then the liquid is transported to the evaporation cavities 212 through the liquid replenishment passage 201, which facilitates realization of gas-liquid recycling, and improves the heat dissipation performance of the loop heat pipe 200. That is, multiple circulation passages are formed through the vapor passage 204, the flow return passage 205, the liquid replenishment passage 201 and the at least two evaporation cavities 212.

It should be noted that the passage formed by the communication between the pipeline unit 211 and the evaporation cavities 212 can be understood as a circulation passage through which the working medium circulates, and the shape of the circulation passage is not necessarily a single ring. For example, at least two vapor passages 204 share part of the flow return passage 205, and are communicated with the evaporation cavities 212 through the liquid replenishment passage 201 to form circulation passages. For another example, at least two flow return passages 205 share part of the vapor passage 204 and are communicated with the evaporation cavities 212 through the liquid replenishment passage 201 to form circulation passages. For still another example, at least two flow return passages 205 are communicated with at least two vapor passages 204 respectively, and the at least two flow return passages 205 share the liquid replenishment passage 201 and are communicated with the evaporation cavities 212 to form circulation passages.

In addition, at least part of the second capillary structure 230 is provided in the liquid replenishment passage 201 and the flow return passage 205, which facilitates quickly absorbing of the liquid in the liquid replenishment passage 201 and the flow return passage 205 by the second capillary structure 230, and transporting the liquid to the first capillary structure 220 through the second capillary structure 230 and finally to the evaporation cavities 212 through the first capillary structure 220, so as to implement rapid liquid replenishment of the evaporation cavities 212.

On the basis of the above embodiments, in some embodiments, the vapor passage 204 includes a second partition part 214 and first flow passages 204a that are communicated with the evaporation cavities 212 in a one-to-one correspondence, and two adjacent first flow passages 204a are separated by the second partition part 214. In this way, by separating the two adjacent first flow passages 204a through the second partition part 214, mutual interference between the evaporation cavities 212 can be further avoided, thereby avoiding mutual interference between the heat sources 300 and ensuring the heat dissipation efficiency of the respective heat sources 300.

It should be noted that the second partition part 214 can be implemented in a variety of ways, including at least one of a partition plate, an isolation strip, an isolation hole, etc.

In some embodiments, the second partition part 214 includes a second partition plate 2141, and the second partition plate 2141 is disposed between two adjacent evaporation cavities 212. In this way, the two adjacent first flow passages 204a are separated by the partition plate to reduce mutual interference, which is easy to be implemented.

In some embodiments, the second partition part 214 includes a second isolation hole 2142, which is used to separate two adjacent first flow passages 204a. In this way, the second isolation hole 2142 can be used to separate two adjacent first flow passages 204a to reduce mutual interference. Besides, the two adjacent first flow passages 204a are spaced apart through the isolation hole, thereby reducing the direct transfer of heat through the housing component 210 and further reducing mutual interference.

In some embodiments, the second partition part 214 includes a second partition plate 2141 and a second isolation hole 2142. The second isolation hole 2142 cooperates with the second partition plate 2141 to separate two adjacent first flow passages 204a.

In some embodiments, the first partition part 213 and the second partition part 214 are integrally formed.

On the basis of any of the above embodiments of the flow return passage 205, as shown in FIG. 4, in some embodiments, the first capillary structure 220 includes a third body 221 disposed in the liquid replenishment passage 201 and the at least two evaporation cavities 212, a fourth body 222 disposed in the vapor passage 204 and a fifth body 223 disposed in the flow return passage 205. One end of the fourth body 222 is connected to the third body 221 through the vapor outlet 202, the other end of the fourth body 222 is connected to one end of the fifth body 223, and the other end of the fifth body 223 is connected to the third body 221 through the liquid replenishment passage 201. In this way, through the cooperation of the third body 221 with the fourth body 222 and the fifth body 223, the first capillary structure 220 is disposed in the pipeline unit 211 and the evaporation cavities 212, which facilitates adsorption of condensed liquid and facilitates re-transporting of the condensed liquid to the evaporation cavities 212 along the first capillary structure 220 so as to continuously provide liquid to the evaporation cavities 212.

In some embodiments, the third body 221 covers the bottoms of the evaporation cavities 212 and the liquid replenishment passage 201, the fourth body 222 covers the bottom of the vapor passage 204, and the fifth body 223 is disposed at the bottom of the flow return passage 205, so that the condensed liquid can be efficiently absorbed.

It should be noted that the housing component 210 can be implemented in a variety of ways, as long as the pipeline unit 211 and the evaporation cavities 212 can be formed.

On the basis of the above embodiments, as shown in FIGS. 4 to 9, in some embodiments, the housing component 210 includes a first housing 215, a second housing 216 and a third partition part 217. The first housing 215 cooperates with the second housing 216 to form an accommodation cavity, the third partition part 217 and the first partition part 213 are disposed and spaced apart in the accommodation cavity to separate the accommodation cavity into the vapor passage 204, the flow return passage 205, the liquid replenishment passage 201 and the evaporation cavities 212. In this way, through the cooperation of the first housing 215, the second housing 216 and the third partition part 217, it facilitates to separate the accommodation cavity into the vapor passage 204, the flow return passage 205, the liquid replenishment passage 201 and the evaporation cavities 212, which is easy to be implemented.

It should be noted that the first housing 215 and the second housing 216 can be manufactured in a variety of ways, including but not limited to stamping, etching, laser engraving, turning and milling, and other methods.

In some embodiments, the first housing 215 and the second housing 216 are stamped separately and then assembled together.

As shown in FIGS. 4 and 5, the second capillary structure 230 is provided with an avoidance groove 233 to avoid the third partition part 217. In this way, by disposing the avoidance groove 233, the second capillary structure 230 will not interfere with the third partition part 217 and can efficiently block the liquid replenishment ports 203 so that the vapor evaporated from the evaporation cavities 212 will not flow from the liquid replenishment ports 203 into the liquid replenishment passage 201.

In some embodiments, as shown in FIGS. 4, 5 and 11, the third partition part 217 includes a third partition plate 208, and two ends of the third partition plate 208 abut against the first housing 215 and the second housing 216, respectively, to separate part of the vapor passage 204 and part of the evaporation cavities 212 from the flow return passage 205. In this way, the third partition plate 208 separates the part of the vapor passages 204 and the part of the evaporation cavities 212 from the flow return passage 205, thereby reducing gas-liquid mixing that affects the heat dissipation efficiency of the loop heat pipe 200.

On the basis of the above embodiments of the first partition plate 2131 and the second partition plate 2141, as shown in FIGS. 5 and 6, in some embodiments, the first partition part 213 includes a first partition plate 2131, two ends of the first partition plate 2131 respectively abut against the first housing 215 and the second housing 216 to separate two adjacent evaporation cavities 212. The vapor passage 204 includes a second partition part 214 and first flow passages 204a each of which is communicated with a respective evaporation cavity 212. The second partition part 214 includes a second partition plate 2141, and two ends of the second partition plate 2141 respectively abut against the first housing 215 and the second housing 216 to separate two adjacent first flow passages 204a. In this way, the first partition plate 2131, the second partition plate 2141 and the third partition plate 208 are integrally formed with one of the first housing 215 and the second housing 216, which is beneficial to reducing the assembly process and improving the assembly efficiency of the loop heat pipe 200.

As shown in FIG. 11, in some embodiments, the third partition part 217 includes a third isolation hole 209 penetrating the first housing 215 and the second housing 216 to separate part of the vapor passage 204 and part of the evaporation cavities 212 from the flow return passage 205. In this way, the third isolation hole 209 can be used to isolate the part of the vapor passage 204 and the part of the evaporation cavities 212 from the flow return passage 205, thereby reducing the gas-liquid mixing that affects the heat dissipation efficiency of the loop heat pipe 200. Besides, the third isolation hole 209 allows the part of the vapor passage 204 and the part of the evaporation cavities 212 to be spaced apart from the flow return passage 205, thereby reducing the direct transferring of the heat in the vapor passage 204 and the evaporation cavity 212 to the flow return passage 205 through the housing component 210 which will cause the liquid in the flow return passage 205 to be heated and evaporate, resulting in the gas-liquid mixing phenomenon that affects the heat dissipation efficiency of the loop heat pipe 200.

On the basis of the above embodiments of the first isolation hole 2132 and/or the second isolation hole 2142, as shown in FIG. 11, in some embodiments, the housing component 210 includes a first welding layer 2133 that is welded and fixed to the first housing 215 and the second housing 216, and the first isolation hole 2132 is opened in the first welding layer 2133. In this way, part of the first housing 215 is weld together with the second housing 216 through the first welding layer 2133, thereby achieving separation between two adjacent evaporation cavities 212. Then, by opening the first isolation hole 2132 in the first welding layer 2133, the two adjacent evaporation cavities 212 are spaced apart to reduce direct transfer of the heat through the housing component 210 and further reduce mutual interference.

And/or, in some embodiments, the vapor passage 204 includes a second partition part 214 and first flow passages 204a each of which is communicated with a respective evaporation cavity 212. The second partition part 214 includes a second isolation hole 2142 for separating two adjacent first flow passages 204a; the housing component 210 includes a second welding layer 2143 that is welded and fixed to the first housing 215 and the second housing 216, and the second isolation hole 2142 is opened in the second welding layer 2143. In this way, the part of the first housing 215 is weld together with the second housing 216 through the second welding layer 2143 to separate the two adjacent first flow passages 204a. Then, by opening the second isolation hole 2142 in the second welding layer 2143, the two adjacent first flow passages 204a are spaced apart to reduce the direct transfer of the heat through the housing component 210 and further reduce mutual interference.

And/or, in some embodiments, the housing component 210 includes a third welding layer 218 that is welded and fixed to the first housing 215 and the second housing 216, and the third isolation hole 209 is opened in the third welding layer 218. In this way, part of the first housing 215 is welded together with the second housing 216 through the third welding layer 218 to separate part of the vapor passage 204 and part of the evaporation cavities 212 from the flow return passage 205. Then, by opening the third isolation hole 209 in the third welding layer 218, the part of the vapor passage 204 and the part of the evaporation cavities 212 are spaced apart from the flow return passage 205, thereby reducing the direct transfer of the heat in the vapor passage 204 and the evaporation cavity 212 to the flow return passage 205 through the housing component 210 which will cause the liquid in the flow return passage 205 to be heated and evaporate, resulting in the gas-liquid mixing phenomenon which affects the heat dissipation efficiency of the loop heat pipe 200.

On the basis of any of the above embodiments of the first housing 215, as shown in FIGS. 4 and 5, in some embodiments, at least one of the first housing 215 and the second housing 216 is provided with a groove 206, and the other of the first housing 215 and the second housing 216 covers the groove 206 to form an accommodation cavity. In this way, by using the groove 206, it facilitate the formation of the accommodation cavity.

In some embodiments, the first housing 215 is provided with a groove 206, and the second housing 216 is used as a cover. That is, the second housing 216 covers the side of the first housing 215 at the opening of the groove 206, and the groove 206 on the first housing 215 together with the second housing 216 enclose and form the closed pipeline unit 211 and evaporation cavities 212.

In some embodiments, the second housing 216 is provided with a groove 206, and the first housing 215 is used as a cover. That is, the first housing 215 covers the side of the second housing 216 at the opening of the groove 206, and the groove 206 of the second housing 216 together with the first housing 215 enclose and form the closed pipeline unit 211 and evaporation cavities 212.

In some embodiments, each of the first housing 215 and the second housing 216 is provided with a groove 206. That is, the opening of the groove 206 on the first housing 215 and the opening of the groove 206 on the second housing 216 are arranged oppositely, and the grooves 206 of the second housing 216 and the first housing 215 together enclose and form the closed pipeline unit 211 and evaporation cavities 212.

On the basis of the above embodiments, as shown in FIG. 4, in some embodiments, the first housing 215 is provided with a groove 206, the first capillary structure 220 covers the bottom of the groove 206, and the first capillary structure 220 is provided with a first avoidance hole 224 to avoid the first partition part 213 and a third avoidance hole to avoid the third partition part 217. In this way, the first capillary structure 220 covers the bottom of the groove 206, and the partition parts are avoided through the avoidance holes, so that the first capillary structure 220 is integrated onto the first housing 215, covers the second capillary structure 230, and then is assembled with the second housing 216, and thus the loop heat pipe 200 can be manufactured, resulting in high assembly efficiency of the loop heat pipe 200.

In some embodiments, in combination with the above embodiments of the second partition part 214, the first capillary structure 220 is also provided with a second avoidance hole 225 to avoid the second partition part 214.

On the basis of any of the above embodiments, as shown in FIG. 8, in some embodiments, the second housing 216 is provided with a support column 207, the support column 207 avoids the second capillary structure 230 and protrudes in a direction toward the first capillary structure 220. The support column 207 abuts against and cooperates with the first capillary structure 220. In this way, by disposing the support column 207, the first housing 215 and the second housing 216 will not be easily deformed to cause the pipeline unit 211 or the evaporation cavities 212 to be squashed and broken, which is beneficial to improving the reliability of the loop heat pipe 200.

Figure 10:
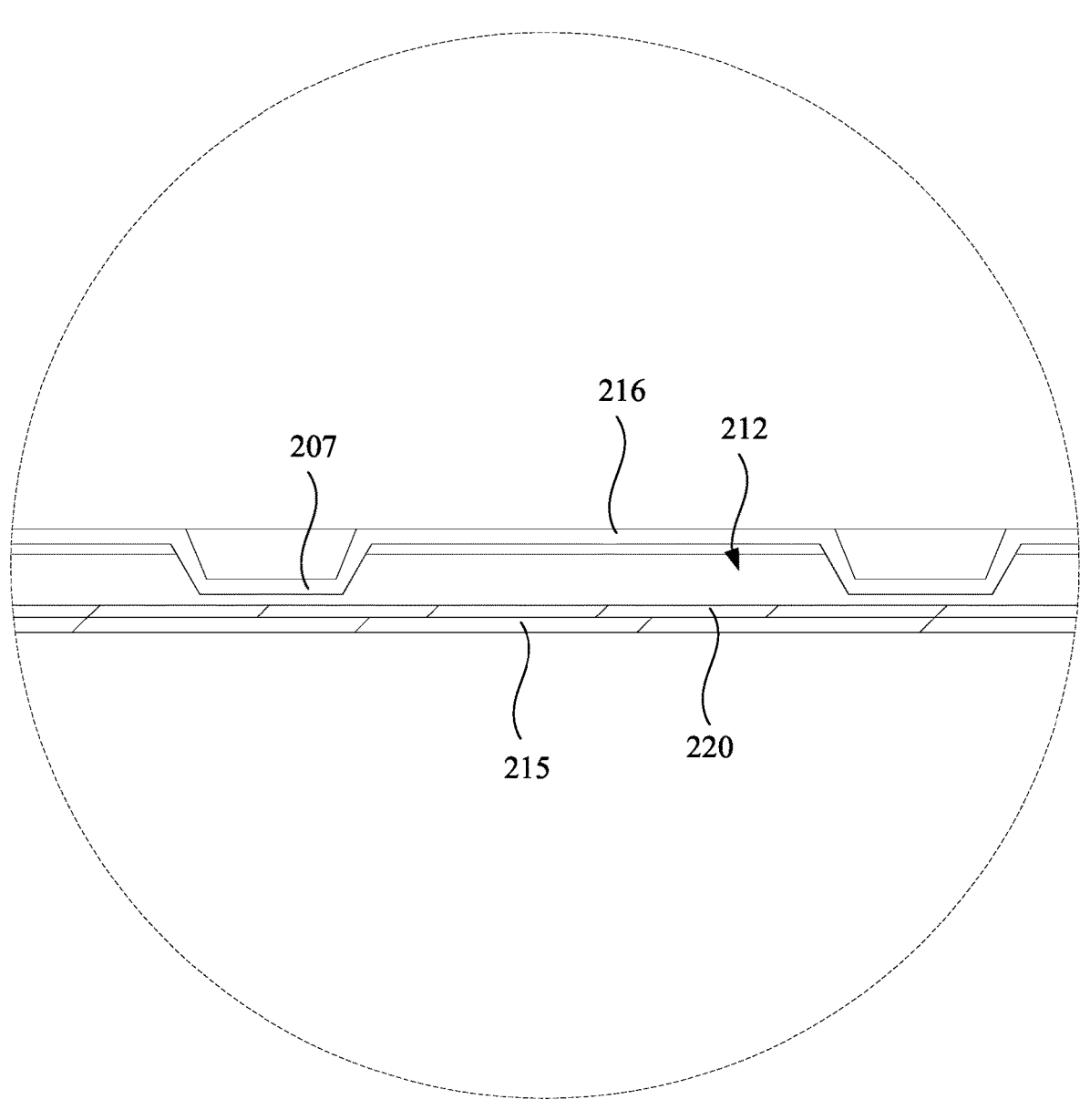
FIG. 10 is an enlarged schematic diagram of area A in another embodiment.

Alternatively, as shown in FIG. 10, in another embodiment, when the second housing 216 is in a non-compressed state, the support column 207 has a clearance fit with the first capillary structure 220; and when the second housing 216 and/or the first housing 215 is in a compressed state, the support column 207 is in contact fit with the first capillary structure 220 to support the first housing 215 and the second housing 216. In this way, since there is a gap between the first capillary structure 220 and the support part, the support part will not block the vaporized cooling medium in the first capillary structure 220, so that the flow efficiency of the cooling medium can be improved. When the body is deformed, the support part contacts the first capillary structure 220 to support the body, and thus the first capillary structure 220 can be used to buffer the force on the body, which can suppress or avoid deformation of the body, and prevent that some areas of the body cannot be effectively supported due to the deviation, which in turn causes deformation of the areas, affecting the heat dissipation effect.

In some embodiments, in some embodiments, one of the first housing 215 and the second housing 216 includes the housing 100 or a battery cover. In this way, one of the first housing 215 and the second housing 216 is integrally formed with the housing 100 or the battery cover, which facilitates the full use of the thickness space of the housing 100 or the battery cover to integrate the loop heat pipe 200, which is beneficial to make the electronic device 10 thinner and lighter.

On the basis of any of the above embodiments of the flow return passage 205, in some embodiments, the first capillary structure 220 is disposed in the evaporation cavities 212, the liquid replenishment passage 201, the vapor passage 204 and the flow return passage 205, and is spaced apart from an inner side wall of the housing component 210. In this way, the arrangement of the first capillary structure 220 will not cause pipe plugging of the loop heat pipe 200.

Figures 12, 13:
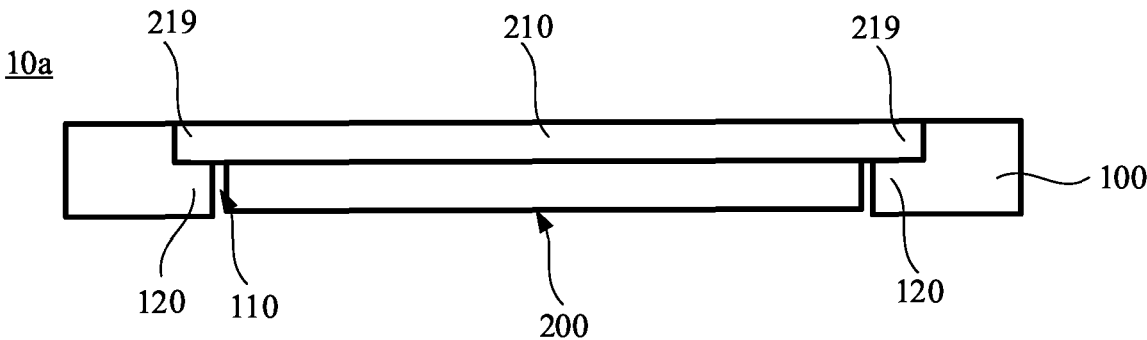
FIG. 12 is a half-section view of a housing assembly shown in another embodiment.
FIG. 13 is a schematic diagram of an internal hardware structure of an electronic device shown in an embodiment.

On the basis of any of the above embodiments of the housing 100, as shown in FIG. 12, in some embodiments, the housing 100 is provided with a receiving hole 110, and at least part of the loop heat pipe 200 is disposed in the receiving hole 110, so that at least part of the loop heat pipe 200 is embedded in the housing 100. In this way, at least part of the loop heat pipe 200 is embedded into the housing 100 through the receiving hole 110, and the thickness space of the housing 100 can be fully utilized to integrate the loop heat pipe 200, that is, the protruding thickness of the heat dissipation structure can be actively reduced, which is beneficial to making the electronic device 10 thinner and lighter.

In some embodiments, the housing component 210 is provided with a skirt 219, the housing 100 is provided with a bearing body 120 disposed on a side wall of the receiving hole 110, and the skirt 219 is fixedly connected to the bearing body 120. In this way, when the loop heat pipe 200 is assembled with the central control, the skirt 219 is clamped on the bearing body 120, and then the skirt 219 is fixedly connected to the bearing body 120 by techniques such as welding or bonding, so that at least part of the loop heat pipe 200 can be easily embedded in the housing 100.

In some embodiments of the present disclosure, a housing assembly is also provided, including a housing and the loop heat pipe in any of the above embodiments, and the loop heat pipe is provided in the housing.

The housing assembly integrates the loop heat pipe onto the housing to facilitate to dissipating heat from at least two heat sources installed on the housing by using the evaporation cavities and then transferring the heat to a cooling part using the pipeline unit, thereby making full use of the housing's space for heat dissipation, improving the heat dissipation performance of the housing, facilitating to improving the heat dissipation efficiency of components integrated onto the housing, especially the heat sources that easily generate heat (such as motherboard chips, CPUs, etc.). As such, the housing assembly has good heat dissipation performance.

In some embodiments of the present disclosure, an electronic device is also provided, including heat sources and the loop heat pipe in any of the above embodiments, or the housing assembly in any of the above embodiments, and the heat sources include at least two heat sources corresponding to the evaporation cavities on a one-to-one basis, the heat sources cooperate with the housing assembly in heat conduction, and at least part of the heat sources overlaps with the evaporation cavities on a orthogonal projection surface in a thickness direction of the loop heat pipe.

The electronic device employing the loop heat pipe in any of the above embodiments or the housing assembly in any of the above embodiments can dissipate heat from at least two heat sources using the loop heat pipe, avoiding the performance of the electronic device from being affected or damage of the electronic device due to local overheating. The electronic device employs the loop heat pipe and thus has good heat dissipation performance, and the manufacturing cost of the loop heat pipe is low, which is beneficial to reducing the heat dissipation cost of the electronic device.

It should be noted that the "bearing body 120" can be "a part of the housing 100", that is, the "bearing body 120" and "other parts of the housing 100, such as the body of the housing 100" are integrally formed and manufactured; or the "bearing body 120" can be an independent member separated from "other parts of the housing 100, such as the body of the housing 100", that is, the "bearing body 120" can be manufactured independently, and then combined with "other parts of the housing 100, such as the body of the housing 100" to form an integrated whole.

Equivalently, "a body" and "a part" can be part of a corresponding "member", that is, "a body" or "a part" is integrally formed and manufactured with "other parts of the member"; or can be an independent member separated from "other parts of the member", that is, "a body" or "a part" can be manufactured independently, and then combined with "other parts of the member" to form an integrated whole. The expressions "a body" and "a part" mentioned above in the present disclosure are only examples for the convenience of reading, and are not intended to limit the protection scope of the present disclosure. Those including the above features and having the same functions should be understood as being equivalent to the technical solution of the present disclosure.

It should be noted that the "second housing 216" can be one of parts of the module "housing component 210", that is, it is assembled into a module with "other members of the housing component 210" and then assembled in a modular manner; or can be relatively independent from "other members of the housing component 210" and can be installed separately, that is, it can be integrated with "other members of the housing component 210" in the device to form an integrated whole.

Equivalently, the members included in a "unit", "component" and "terminal" of the present disclosure can also be flexibly combined, that is, modular production can be carried out according to actual conditions, and modular assembly can be carried out as an independent module; they can also be assembled separately and form a module in the device. The division of the above member in the present disclosure is only one of the embodiments for the convenience of reading, and is not intended to limit the protection scope of the present disclosure. Those including the above members and having the same functions should be understood as being equivalent to the technical solution of the present disclosure.

Referring to FIG. 13, in some embodiments, the electronic device 10 may also include one or more of the following components: a processing component 11, a memory 12, a power supply component 13, a multimedia component 14, an audio component 15, an input/output interface 16, a sensor component 17, and a communication component 18.

The processing component 11 generally controls the overall operations of the electronic device 10, such as operations associated with display, telephone calls, data communications, camera operations, and recording operations. The processing component 11 may include one or more processors to execute instructions so as to implement all or part of the steps of the foregoing methods. In addition, the processing component 11 may include one or more modules to facilitate the interaction between the processing component and other components. For example, the processing component 11 may include a multi-media module to facilitate the interaction between the multi-media component and the processing component.

The memory 12 is configured to store various types of data to support operations on the electronic device. Examples of the data include instructions for any application or method operating on the electronic device, contact data, phone book data, messages, pictures, videos, etc. The memory 12 can be implemented in any type of volatile or non-volatile storage device, such as a static random access memory (SRAM), an electrically erasable programmable read-only memory (EEPROM), an erasable Programmable read-only memory (EPROM), a programmable read-only memory (PROM), a read-only memory (ROM), a magnetic memory, a flash memory, a magnetic disk and an optical disk, or a combination thereof.

The control motherboard includes the processing component and the memory.

The power supply component 13 provides power to various components of the electronic device. The power supply component 13 may include a power management system, one or more power supplies, and other components associated with generating, managing, and distributing power for the electronic device.

The multimedia component 14 includes the display module of the present disclosure to facilitate human-computer interaction. If the display module includes a touch panel, the display module may be implemented as a touch screen to receive input signals from the user. The touch panel includes one or more touch sensors to sense touches, swipes, and gestures on the touch panel. The touch sensor can not only sense a boundary of a touch or swipe action, but also detect the time duration and pressure associated with the touch or swipe operation. In some embodiments, the multimedia component 14 includes a front camera and/or a rear camera. When the electronic device is in an operating mode, such as a shooting mode or a video mode, the front camera and/or the rear camera can receive external multimedia data. Each of the front camera and the rear camera can be a fixed optical lens system or have a focal length and optical zoom capabilities.

The audio component 15 is configured to output and/or input audio signals. For example, the audio component includes a microphone (MIC). When the electronic device is in an operation mode, such as a call mode, a recording mode or a voice recognition mode, the microphone is configured to receive external audio signals. The received audio signals may be further stored in the memory or sent via the communication component. In some embodiments, the audio component 15 further includes a speaker configured to output the audio signals.

The input/output interface 16 provides an interface between the processing component and a peripheral interface module. The peripheral interface module may be a keyboard, a click wheel, a button, or the like. The button may include but is not limited to a home button, a volume button, a start button, and a lock button.

The sensor component 17 includes one or more sensors configured to provide various state evaluations of the electronic device. For example, the sensor component 17 can detect an on/off state of the electronic device and relative positioning of a component such as a display or a keypad of the electronic device. The sensor component 17 can also detect a position change of the electronic device or a component of the electronic device, presence or absence of contact with the electronic device by the user, orientation or acceleration/deceleration of the electronic device, and temperature changes of the electronic device. The sensor component 17 may include a proximity sensor configured to detect presence of a nearby object without any physical contact. The sensor component may also include a photosensitive element, such as a CMOS or CCD image sensor, configured to be used in imaging applications. In some embodiments, the sensor component 17 may also include an acceleration sensor, a gyroscope sensor, a magnetic sensor, a pressure sensor or a temperature sensor.

The communication component 18 is configured to facilitate wired or wireless communication between the electronic device and other devices. The electronic device can access a wireless network based on a communication standard, such as Wi-Fi, 2G, 3G, 4G, 5G or 6G, or a combination thereof. In an exemplary embodiment, the communication component 18 receives a broadcast signal or broadcast related information from an external broadcast management system via a broadcast channel. In an exemplary embodiment, the communication component 18 further includes a near field communication (NFC) module to facilitate short-range communication. For example, the NFC module can be implemented based on a radio frequency identification (RFID) technology, an infrared data association (IrDA) technology, an ultra-wideband (UWB) technology, a Bluetooth (BT) technology or other technologies.

In the description of the present disclosure, it should be understood that the orientation or positional relationship indicated by the terms "center", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", etc. are based on the orientation or positional relationship shown in the drawings, are only for the convenience of describing the present disclosure and simplifying the description, and do not indicate or imply that the device or element referred to must have a specific orientation or be constructed and operate in a specific orientation, and therefore cannot be construed as limitations on the present disclosure.

Furthermore, the terms "first", "second", etc. are used for descriptive purposes only and cannot be understood as indicating or implying relative importance or implicitly indicating the quantity of indicated technical features. Thus, the features defined by "first," "second," etc. may explicitly or implicitly include at least one of these features. In the description of the present disclosure, "a plurality" means at least two, such as two, three, etc., unless otherwise expressly and specifically limited.

In the present disclosure, unless otherwise explicitly specified and limited, the terms "install", "communicate", "connect", "fix" and so on should be understood in a broad sense. For example, it can be a fixed connection or a detachable connection, or be integrated; it can be a mechanical connection or an electrical connection; it can be a direct connection or an indirect connection through an intermediate medium; it can be an internal communication between two elements or an interactive relationship between two elements, unless otherwise clearly indicated. For those of ordinary skill in the art, the specific meanings of the above terms in the present disclosure can be understood according to specific conditions.

In the present disclosure, unless otherwise expressly specified and limited, a first feature being "on" or "under" a second feature may mean that the first and second features are in direct contact, or the first and second features may be in indirect contact through an intermediate medium. Furthermore, the first feature is "on", "above" and "on top of" the second feature may mean that the first feature is directly above or obliquely above the second feature, or simply means that the first feature is in a higher level than the second feature. The first feature being "below", "under" and "beneath" the second feature may mean that the first feature is directly below or obliquely below the second feature, or simply means that the first feature has a smaller height than the second feature in level.

It should be noted that when an element is said to be "fixed to", "disposed on", "fixedly provided in" or "mounted on" another element, it can be directly on the other element or there may be an intervening element. When an element is said to be "connected to" another element, it can be directly connected to the other element or there may also be an intervening element.

The technical features of the above embodiments can be combined in any way. To simplify the description, not all possible combinations of the technical features in the above embodiments are described. All the possible combinations should be considered to be within the scope of the specification as long as there is no contradiction in the combination of these technical features.

The above embodiments only provide several implementations of the present disclosure, and the description thereof is relatively specific and detailed, but it should not be construed as limitation on the scope of the present disclosure. It should be noted that for those of ordinary skill in the art, modifications and improvements can be made without departing from the inventive concept of the present disclosure, which all fall within the protection scope of the present disclosure.

EXPLANATION OF REFERENCE NUMERALS

10, electronic device; 11, processing component; 12, memory; 13, power supply component; 14, multimedia component; 15, audio component; 16, input/output interface; 17, sensor component; 18, communication component; 10*a*, housing assembly; 100, housing; 110, receiving hole; 120, bearing body; 200, loop heat pipe; 210, housing component; 211, pipeline unit; 201, liquid replenishment passage; 204, vapor passage; 204*a*, first flow passage; 205, flow return passage; 212, evaporation cavity; 202, vapor outlet; 203, liquid replenishment port; 213, first partition part; 2131, first partition plate; 2132, first isolation hole; 2133, first welding layer; 214, second partition part; 2141, second partition plate; 2142, second isolation hole; 2143, second welding layer; 215, first housing; 206, groove; 216, second housing; 207, support column; 217, third partition part; 208, third partition plate; 209, third isolation hole; 218, third welding layer; 219, skirt; 220, first capillary structure; 221, third body; 222, fourth body; 223, fifth body; 224, first avoidance hole; 225, second avoidance hole; 230, second capillary structure; 231, first body; 232, second body; 233, avoidance groove; 300, heat source.

What is claimed is:

1. A loop heat pipe, comprising:
a housing component, provided with a pipeline unit, a first partition part and at least two evaporation cavities, wherein the pipeline unit is provided with a liquid replenishment passage, the at least two evaporation cavities are spaced apart in a length direction of the liquid replenishment passage, two adjacent evaporation cavities of the at least two evaporation cavities are separated by the first partition part, and at least one of the evaporation cavities comprises a vapor outlet communicated with one end of the pipeline unit and a liquid replenishment port communicated with the liquid replenishment passage;
a first capillary structure, wherein at least part of the first capillary structure is disposed in the liquid replenishment passage and the at least two evaporation cavities; and
a second capillary structure, disposed in at least one of the liquid replenishment passage and the evaporation cavities, wherein the second capillary structure comprises first bodies that correspond to the evaporation cavities on a one-to-one basis, at least one of the first bodies blocks the liquid replenishment port of the corresponding evaporation cavity, and at least part of the at least one of the first bodies is in contact with the first capillary structure.

2. The loop heat pipe according to claim 1, wherein the first bodies are stacked on the first capillary structure to block the liquid replenishment ports; or at least part of the first bodies is filled in the liquid replenishment passage to block the liquid replenishment ports.

3. The loop heat pipe according to claim 1, wherein the loop heat pipe further comprises a working medium provided in the pipeline unit and the evaporation cavities, and the first bodies block the liquid replenishment ports to cause the working medium to move toward the vapor outlets.

4. The loop heat pipe according to claim 1, wherein at least one of the following is satisfied:
a thickness of the first capillary structure is H1, 0.02 mm≤H1≤0.1 mm;
the second capillary structure comprises at least one layer of capillary structure;
a thickness of the second capillary structure is H2, 0.1 mm≤H2≤0.3 mm; and
wherein a maximum thickness of the loop heat pipe is 0.2 mm to 0.5 mm.

5. The loop heat pipe according to claim 1, wherein at least one of the following is satisfied:

the first partition part comprises a first partition plate, and the first partition plate is disposed between two adjacent evaporation cavities; and
the first partition part comprises a first isolation hole, and the first isolation hole is configured to separate two adjacent evaporation cavities.

6. The loop heat pipe according to claim 1, wherein the second capillary structure comprises a second body disposed in the liquid replenishment passage, and the first bodies are in contact with the first capillary structure and connected with the second body to block the liquid replenishment ports.

7. The loop heat pipe according to claim 1, wherein the pipeline unit further comprises a vapor passage and a flow return passage, one end of the vapor passage is communicated with the vapor outlets of the at least two evaporation cavities, the other end of the vapor passage is communicated with one end of the flow return passage, and the other end of the flow return passage is communicated with the liquid replenishment passage;
wherein at least part of the second capillary structure is provided in the liquid replenishment passage and the flow return passage.

8. The loop heat pipe according to claim 7, wherein the vapor passage comprises a second partition part and first flow passages that are communicated with the evaporation cavities in a one-to-one correspondence, and two adjacent first flow passages are separated by the second partition part.

9. The loop heat pipe according to claim 8, wherein at least one of the following is satisfied:
the first partition part is adjacent to the second partition part to cause the evaporation cavities to be communicated with the corresponding first flow passages;
wherein the second partition part comprises a second partition plate, and the second partition plate is disposed between two adjacent evaporation cavities; and
the second partition part comprises a second isolation hole, and the second isolation hole is configured to separate two adjacent first flow passages.

10. The loop heat pipe according to claim 8, wherein the first capillary structure comprises a third body disposed in the liquid replenishment passage and the at least two evaporation cavities, a fourth body disposed in the vapor passage, and a fifth body disposed in the flow return passage, one end of the fourth body is connected to the third body through the vapor outlets, the other end of the fourth body is connected to one end of the fifth body, and the other end of the fifth body is connected to the third body through the liquid replenishment passage.

11. The loop heat pipe according to claim 7, wherein the housing component comprises a first housing, a second housing and a third partition part, the first housing and the second housing cooperate to form an accommodation cavity, and the third partition part and the first partition part are disposed and spaced apart in the accommodation cavity to separate the accommodation cavity into the vapor passage, the flow return passage, the liquid replenishment passage and the evaporation cavities.

12. The loop heat pipe according to claim 11, wherein at least one of the following is satisfied:
the first partition part comprise a first partition plate, and two ends of the first partition plate respectively abut against the first housing and the second housing to separate two adjacent evaporation cavities;
the vapor passage comprises a second partition part and first flow passages that are communicated with the evaporation cavities in a one-to-one correspondence, the second partition part comprises a second partition plate, and two ends of the second partition plate respectively abut against the first housing and the second housing to separate two adjacent first flow passages; and the third partition part comprises a third partition plate, and two ends of the third partition plate respectively abut against the first housing and the second housing to separate part of the vapor passage and part of the evaporation cavities from the flow return passage.

13. The loop heat pipe according to claim 11, wherein at least one of the following is satisfied:

the third partition part comprises a third isolation hole, and the third isolation hole is configured to separate part of the vapor passage and part of the evaporation cavities from the flow return passage;

wherein the first partition part comprises a first isolation hole, and the first isolation hole is configured to separate two adjacent evaporation cavities, and wherein the housing component comprises a first welding layer that is welded and fixed to the first housing and the second housing, and the first isolation hole is opened in the first welding layer;

the vapor passage comprises a second partition part and first flow passages that are communicated with the evaporation cavities in a one-to-one correspondence, and the second partition part comprises a second isolation hole configured to separate two adjacent first flow passages; and wherein the housing component comprises a second welding layer that is welded and fixed to the first housing and the second housing, and the second isolation hole is opened in the second welding layer; and the housing component comprises a third welding layer that is welded and fixed to the first housing and the second housing, and the third isolation hole is opened in the third welding layer.

14. The loop heat pipe according to claim 11, wherein at least one of the first housing and the second housing is provided with a groove, and the other one of the first housing and the second housing covers the groove to form the accommodation cavity.

15. The loop heat pipe according to claim 14, wherein at least one of the following is satisfied:

the first housing is provided with the groove, the first capillary structure covers a bottom of the groove, the first capillary structure is provided with a first avoidance hole to avoid the first partition part and a third avoidance hole to avoid the third partition part, and the second capillary structure is disposed on the first capillary structure; and the first partition part and the third partition part are stamped and formed with the second housing.

16. The loop heat pipe according to claim 11, wherein at least one of the following is satisfied:

the second housing is provided with a support column, the support column avoids the second capillary structure and protrudes in a direction toward the first capillary structure;

the support column abuts against and cooperates with the first capillary structure; and when the second housing is in a non-compressed state, the support column is in clearance fit with the first capillary structure; and when the second housing and/or the first housing is in a compressed state, the support column is in contact fit with the first capillary structure to support the first housing and the second housing.

17. The loop heat pipe according to claim 7, wherein the first capillary structure is disposed in the evaporation cavities, the liquid replenishment passage, the vapor passage and the flow return passage, and is disposed to be spaced apart from an inner side wall of the housing component.

18. A housing assembly, comprising:

a housing; and a loop heat pipe provided in the housing, wherein the loop heat pipe comprises:

a housing component, provided with a pipeline unit, a first partition part and at least two evaporation cavities, wherein the pipeline unit is provided with a liquid replenishment passage, the at least two evaporation cavities are spaced apart in a length direction of the liquid replenishment passage, two adjacent evaporation cavities of the at least two evaporation cavities are separated by the first partition part, and each of the evaporation cavities comprises a vapor outlet communicated with one end of the pipeline unit and a liquid replenishment port communicated with the liquid replenishment passage;

a first capillary structure, wherein at least part of the first capillary structure is disposed in the liquid replenishment passage and the at least two evaporation cavities; and a second capillary structure, disposed in at least one of the liquid replenishment passage and the evaporation cavities, wherein the second capillary structure comprises first bodies that correspond to the evaporation cavities on a one-to-one basis, each of the first bodies blocks the liquid replenishment port of the corresponding evaporation cavity, and at least part of each of the first bodies is in contact with the first capillary structure.

19. The housing assembly according to claim 18, wherein at least one of the following is satisfied:

the housing is provided with a hollow hole, and at least part of the loop heat pipe is disposed in the hollow hole, to cause at least part of the loop heat pipe to be embedded in the housing; and wherein the housing assembly is provided with a skirt, the housing is provided with a bearing body disposed on a side wall of the hollow hole, and the skirt is fixedly connected to the bearing body.

20. An electronic device, comprising:

heat sources; and a loop heat pipe, comprising:

a housing component, provided with a pipeline unit, a first partition part and at least two evaporation cavities, wherein the pipeline unit is provided with a liquid replenishment passage, the at least two evaporation cavities are spaced apart in a length direction of the liquid replenishment passage, two adjacent evaporation cavities of the at least two evaporation cavities are separated by the first partition part, and at least one of the evaporation cavities comprises a vapor outlet communicated with one end of the pipeline unit and a liquid replenishment port communicated with the liquid replenishment passage;

a first capillary structure, wherein at least part of the first capillary structure is disposed in the liquid replenishment passage and the at least two evaporation cavities; and a second capillary structure, disposed in at least one of the liquid replenishment passage and the evaporation cavities, wherein the second capillary structure comprises first bodies that correspond to the evaporation cavities on a one-to-one basis, at least one of the first bodies blocks the liquid replenishment port of the corresponding evaporation cavity, and at least part of the at least one of the first bodies is in contact with the first capillary structure, wherein the heat sources comprise at least two heat sources corresponding to the evaporation cavities on a one-to-one basis, the heat sources and the housing component cooperate in heat conduction, and at least part of the heat sources overlaps with the corresponding evaporation cavities on a orthogonal projection surface in a thickness direction of the loop heat pipe.

* * * * *